(12) United States Patent
Angelucci et al.

(10) Patent No.: US 10,285,277 B1
(45) Date of Patent: May 7, 2019

(54) METHOD OF MANUFACTURING CIRCUITS USING THICK METALS AND MACHINED BULK DIELECTRICS

(71) Applicant: Lockheed Martin Corporation, Bethesda, MD (US)

(72) Inventors: Marc T. Angelucci, Cherry Hill, NJ (US); Anthony R. Niemczyk, Levittown, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 487 days.

(21) Appl. No.: 14/985,727

(22) Filed: Dec. 31, 2015

(51) Int. Cl.
 *H05K 3/10* (2006.01)
 *H05K 3/22* (2006.01)
 *H01Q 21/00* (2006.01)

(52) U.S. Cl.
 CPC ......... *H05K 3/101* (2013.01); *H01Q 21/0087* (2013.01); *H05K 3/22* (2013.01)

(58) Field of Classification Search
 CPC ........ H01P 11/003; H01P 11/006; H01P 1/20; H01P 1/08; H05K 3/36; H05K 3/101; H05K 3/22; B23P 19/00–19/12; H01Q 21/0087
 See application file for complete search history.

(56) References Cited

U.S. PATENT DOCUMENTS

| | | | | |
|---|---|---|---|---|
| 5,375,034 A * | 12/1994 | Foyt | ...................... | G01L 9/0073 204/192.11 |
| 5,584,120 A * | 12/1996 | Roberts | .................. | H01R 31/00 156/154 |
| 5,682,674 A * | 11/1997 | Yamazaki | ........... | H01P 1/20336 29/600 |
| 5,987,732 A * | 11/1999 | Lee | ......................... | H01L 21/50 257/E21.499 |
| 7,057,479 B2 * | 6/2006 | Furuya | ...................... | H01P 1/20 333/202 |
| 7,536,780 B2 * | 5/2009 | Shimizu | .............. | H01L 21/4857 29/830 |
| 7,578,058 B2 * | 8/2009 | Endou | ................. | H01L 21/4807 156/252 |
| 8,572,831 B2 * | 11/2013 | Kruglick | ................ | H05B 6/105 29/426.1 |
| 9,671,520 B2 * | 6/2017 | Botto | ....................... | G01V 5/12 |
| 2002/0000899 A1 * | 1/2002 | Hiratsuka | ........... | H01P 1/20318 333/202 |
| 2002/0005805 A1 * | 1/2002 | Ogura | .................... | C03C 17/28 343/700 R |
| 2002/0135444 A1 * | 9/2002 | Ida | ...................... | H01P 1/20363 333/238 |
| 2003/0020569 A1 * | 1/2003 | Nakakubo | .............. | H01P 1/203 333/204 |

(Continued)

*Primary Examiner* — A. Dexter Tugbang
*Assistant Examiner* — Kaying Kue
(74) *Attorney, Agent, or Firm* — Howard IP Law Group

(57) ABSTRACT

A method of manufacturing an electrical circuit from bulk materials includes the steps of machining a first bulk dielectric material, forming a conductive element, and placing the conductive element on a first side the first bulk dielectric material. The method further includes the step of machining a second bulk dielectric material and placing the second bulk dielectric material on the first side of the first bulk dielectric material and over the conductive element. The first bulk dielectric material and the second bulk dielectric material may be laminated together.

11 Claims, 6 Drawing Sheets

(56) References Cited

U.S. PATENT DOCUMENTS

| | | | | |
|---|---|---|---|---|
| 2003/0030515 | A1* | 2/2003 | Song | H01P 7/065 333/219 |
| 2004/0021463 | A1* | 2/2004 | Miyazawa | G01R 29/0878 324/252 |
| 2005/0155789 | A1* | 7/2005 | Suzuki | B32B 15/08 174/255 |
| 2005/0237134 | A1* | 10/2005 | Furuya | H01P 1/20 333/202 |
| 2007/0000685 | A1* | 1/2007 | Inoue | H05K 1/117 174/255 |
| 2009/0125746 | A1* | 5/2009 | Rofougaran | H01L 23/66 713/400 |
| 2011/0051375 | A1* | 3/2011 | Ammar | H01L 23/552 361/728 |
| 2013/0328730 | A1* | 12/2013 | Guterman | B29C 33/76 343/702 |
| 2015/0230326 | A1* | 8/2015 | Botto | G01V 5/12 378/121 |

* cited by examiner

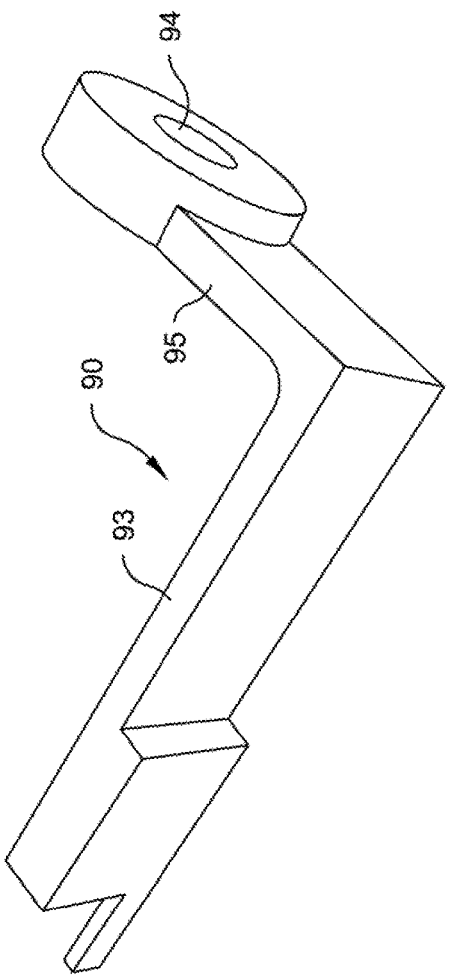
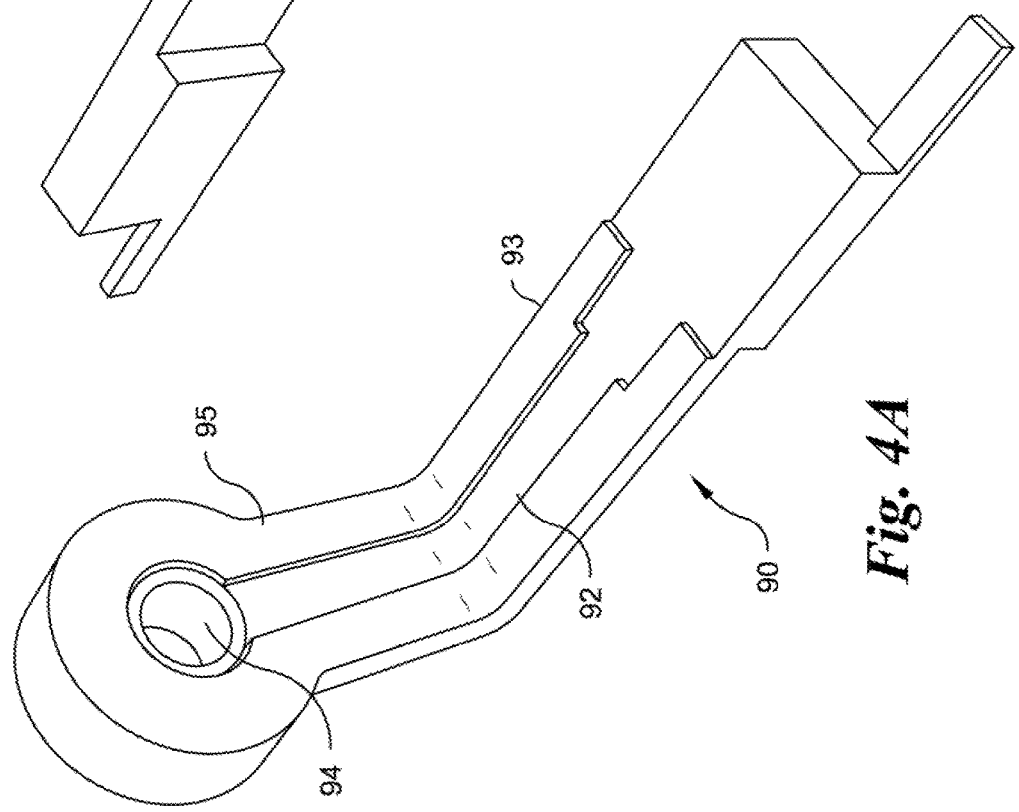

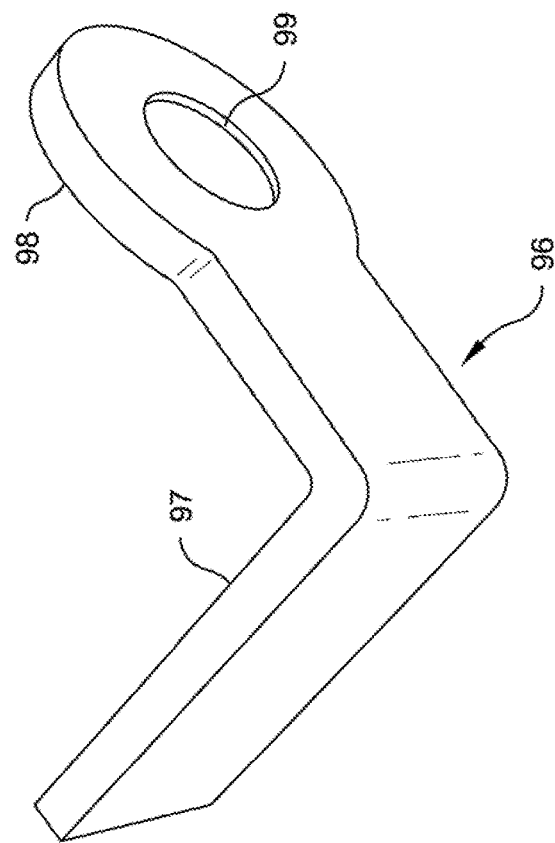
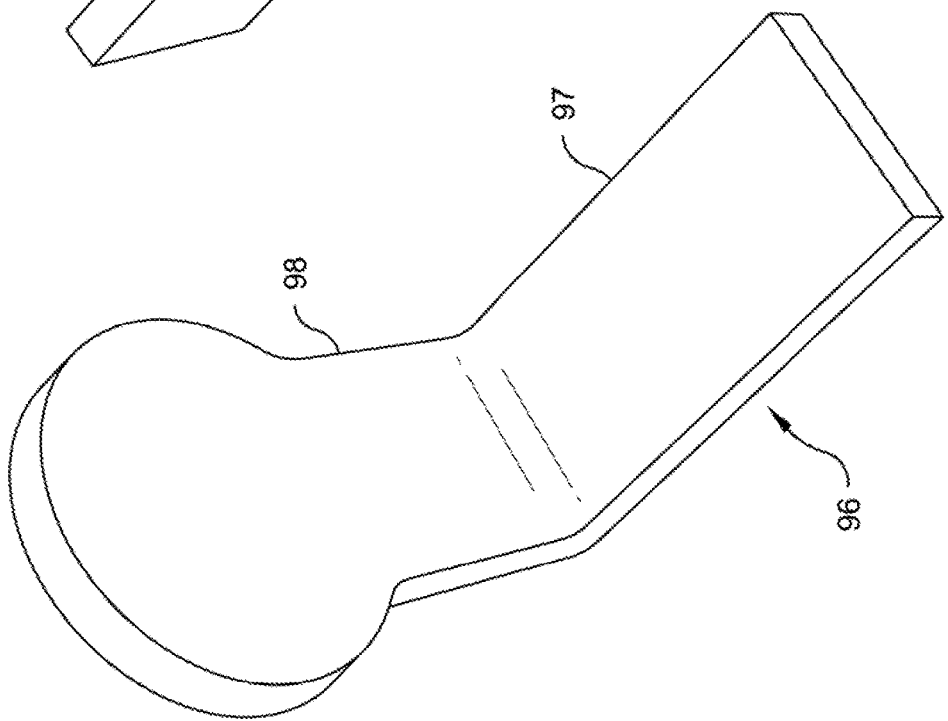
Fig. 5B
Fig. 5A

METHOD OF MANUFACTURING CIRCUITS USING THICK METALS AND MACHINED BULK DIELECTRICS

FIELD OF THE INVENTION

The present disclosure relates generally to methods of manufacturing electrical circuits.

BACKGROUND

Electrical circuits are typically constructed using printed circuit board (PCB) manufacturing techniques. A PCB is a composite structure comprising one or more dielectric material layers having a thin (e.g. 0.001 inch-0.003 inch) metal (e.g. copper) laminate bonded thereto. The metal laminate is patterned or etched, forming conductive traces or transmission lines for carrying electrical signals. Multilayer PCBs are realized when two or more layers of dielectric material having patterned metal bonded thereto are laminated together under heat and pressure. Electrical interconnections made through layers of the PCB are typically achieved using metal-plated holes, or vias. Ground and power planes are provided for distributing voltages to the circuit components arranged on the PCB. Particularly in the case of relatively simple circuits, including those not utilizing vias, complicated conductive traces, or buried or surface mounted components, these PCB methods of manufacturing are unnecessarily complex and costly.

Alternative methods of manufacturing electrical circuits are desired.

SUMMARY

In one embodiment, a method of manufacturing a plurality of electrical circuits is provided. The method includes the step of forming an assembly comprising a plurality of conjoined electrical circuits. The assembly is formed by machining a plurality of first features in a first bulk dielectric material. Each first feature is associated with one of the plurality of electrical circuits. A plurality of second features are machined in a second bulk dielectric material. Each second feature is associated with one of the plurality of electrical circuits. A plurality of preformed electrically conductive elements are placed or positioned on a first side of the first bulk dielectric material, wherein each conductive element is associated with a respective one of the electrical circuits. The second bulk dielectric material is placed on the first side of the first bulk dielectric material and over the plurality of conductive elements forming the assembly. The assembly may be laminated, and subsequently machined to separate each of the plurality of conjoined electrical circuits from one another.

In another embodiment, a method of manufacturing an electrical circuit from bulk materials is provided. The method includes the steps of machining a first bulk dielectric material, forming (e.g. machining) a conductive element, and placing the conductive element on a first side the first bulk dielectric material. The method may further include the step of machining a second bulk dielectric material, and placing the second bulk dielectric material on the first side of the first bulk dielectric material and over the conductive element. The first bulk dielectric material and the second bulk dielectric material may be laminated together.

BRIEF DESCRIPTION OF THE DRAWINGS

FIGS. 4A and 4B illustrate a preformed first bulk dielectric material used in an electric circuit manufactured according to an embodiment of the present disclosure.

FIGS. 5A and 5B illustrate a preformed second bulk dielectric material used in an electric circuit manufactured according to an embodiment of the present disclosure.

DETAILED DESCRIPTION

Figure 1:
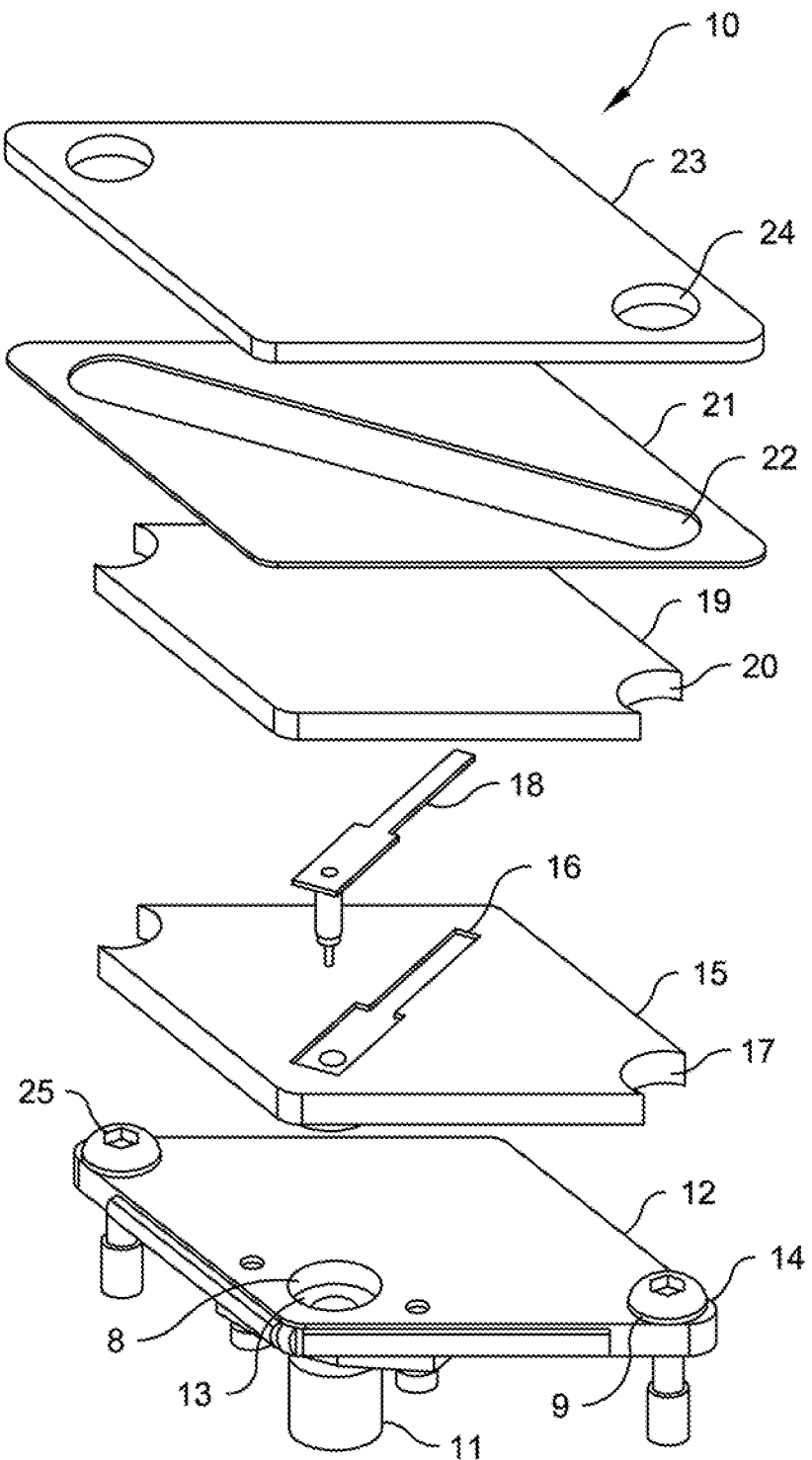
FIG. 1 is an exploded perspective view of an antenna radiating element manufactured according to an embodiment of the present disclosure.

It is to be understood that the figures and descriptions of the present invention have been simplified to illustrate elements that are relevant for a clear understanding of the present invention, while eliminating, for purposes of clarity, many other elements typically found in electrical circuits, including RF electrical circuits. However, because such elements are well known in the art, and because they do not facilitate a better understanding of the present invention, a discussion of such elements is not provided herein. The disclosure herein is directed to all such variations and modifications known to those skilled in the art.

In the following detailed description, reference is made to the accompanying drawings that show, by way of illustration, specific embodiments in which the invention may be practiced. It is to be understood that the various embodiments of the invention, although different, are not necessarily mutually exclusive. Furthermore, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout several views.

Embodiments of the present disclosure relate to improved methods of manufacturing electrical circuits. These methods generally include manufacturing electrical circuits using preformed or prefabricated electrical conductors, as well as bulk dielectric materials which have been machined or otherwise formed into a desired configuration prior to the assembly of the circuit. Embodiments of the present disclosure provide several benefits over prior art PCB-based manufacturing methods, including significantly reduced cost and complexity, as well as increased power handling via the use of thicker conductive components (e.g. 0.025 inch) compared to those resulting from PCB fabrication processes.

In one embodiment of the present disclosure, a method of manufacturing a plurality of electrical circuits is provided. The method includes the step of forming an assembly comprising a plurality of conjoined electrical circuits. The assembly is formed by machining a plurality of first features in a first bulk dielectric material. Each first feature is associated with one of the plurality of electrical circuits. A plurality of preformed electrically conductive elements are then placed on a first side of the first bulk dielectric material, wherein each conductive element is associated with a respective one of the electrical circuits. A plurality of second features are machined in a second bulk dielectric material. Each second feature is associated with one of the plurality of electrical circuits. The second bulk dielectric material is placed on the first side of the first bulk dielectric material and over the plurality of conductive elements. This assembly may be laminated, and subsequently machined to separate each of the plurality of conjoined electrical circuits from one another.

A method of manufacturing an electrical circuit from bulk materials is also provided. The method includes the steps of machining a first bulk dielectric material, forming an electrically conductive element, and placing the electrically conductive element on a first side the first bulk dielectric material. The method may further include the step of machining a second bulk dielectric material, and placing the second bulk dielectric material on the first side of the first bulk dielectric material and over the electrically conductive element. The first bulk dielectric material and the second bulk dielectric material may be laminated together.

FIG. 1 is an exploded perspective view of an antenna radiating element (e.g. an RF antenna element) manufactured according to an embodiment of the present disclosure. Antenna element 10 comprises an RF connector 11. In the exemplary embodiment, RF connector 11 comprises an electrically conductive metallic component which may be formed, for example, via casting and/or machining material stock. RF connector 11 may be comprised of multiple sub-components fastened or otherwise attached to one another, or may be formed of a single monolithic piece of machined material. RF connector 11 comprises a plurality of features formed therein. For example, first apertures 14 are configured to receive a respective fastener 25, and one or more second apertures 13 are provided and facilitate an electrical connection to a radiating element 18. Fasteners 25 may be used to secure an assembled antenna element to, for example, a larger antenna array structure (not shown).

Arranged on a top surface of RF connector 11 may be a base element or layer 12. Base element 12 may be formed of any convenient metal. In the exemplary embodiment, base element 12 is formed of aluminum and is multi-use. Specifically, it serves as the groundplane, a physical attachment structure, and also as heatsink for internally generated heat. Base element 12 may comprise a preformed (e.g. stamped or machined) layer of sheet metal sized to be fitted onto the top surface of RF connector 11. Base element 12 may comprise features formed (e.g. machined or stamped) therein, including partial apertures 9 for accommodating fasteners 14, as well as an aperture 8 corresponding to second aperture 13 formed in RF connector 11.

A first dielectric element or layer 15 is provided and formed from dielectric material (e.g. machined bulk dielectric material). First dielectric element 15 includes features such as partial-apertures 17 and a recess 16. First dielectric element 15 is configured to be placed on base element 12. Recess 16 is correspondingly sized to an electrically conductive radiating element 18. Radiating element 18 is configured to be inserted into and held within recess 16 of first dielectric element 15 during a manufacturing process. Radiating element 18 is preformed prior to the assembly of antenna element 10. Specifically, radiating element 18 may be formed, for example, by casting and/or machining processes.

A second dielectric element or layer 19 is provided and formed from dielectric material (e.g. machined bulk dielectric material). Second dielectric element 19 includes features such as partial apertures 20 formed therein. During the manufacture of antenna element 10, second dielectric element 19 is configured to be placed on a top surface of first dielectric element 15, and over radiating element 18. A first metal element or layer 21 (e.g. a copper element) may comprise a sheet of metal or metal stock. The material may be, for example, stamped or machined to a targeted size and shape, as well as to form any features therein, such as a slotted antenna aperture 22 formed therethrough. Metal element 21 is configured to be placed over second dielectric element 19.

A third dielectric element or layer 23 is provided and formed from dielectric material (e.g. machined bulk dielectric material). Third dielectric element 23 includes features such as apertures 24 formed therein (e.g. machined or stamped). Third dielectric element 23 is configured to be placed or positioned over metal element 21 during the manufacturing process. First dielectric element 15, radiating element 18, second dielectric element 19, metal element 21 and third dielectric element 23 are assembled as described, and may be laminated together (e.g. with a preform thermoset epoxy) to form a subassembly. The subassembly may be attached to RF connector 11 via base element 12 to form an assembled antenna element 10.

It should be understood that first, second and third dielectric elements 15,19,23 are formed from bulk dielectric materials. Each dielectric element 15,19,23 may be been independently (i.e. separately) machined or otherwise processed into a targeted size and shape, and to include select features (e.g. recesses, apertures, etc.), prior to assembly of antenna element 10. Likewise, base element 12, metal element 21 and feed element 18 are independently prefabricated or preformed prior to assembly of antenna element 10. These components also may be made from bulk material, for example, sheet metal or metal stock, or may be cast and further processed into a desired form via metal forming techniques, such as drilling, milling, and other machining operations, as well as stamping, extruding, and the like.

As described above, embodiments of antenna element 10 of FIG. 1 may be produced individually. For example, the illustrated dielectric elements and metallic elements and components may be preformed individually or separately, assembled, laminated together and attached to an individual base element and RF connector. In other embodiments, as will be set forth in greater detail with respect to FIGS. 2 and 3, a plurality of antenna elements can be produced simultaneously using a bulk or batch manufacturing process.

Figure 2:
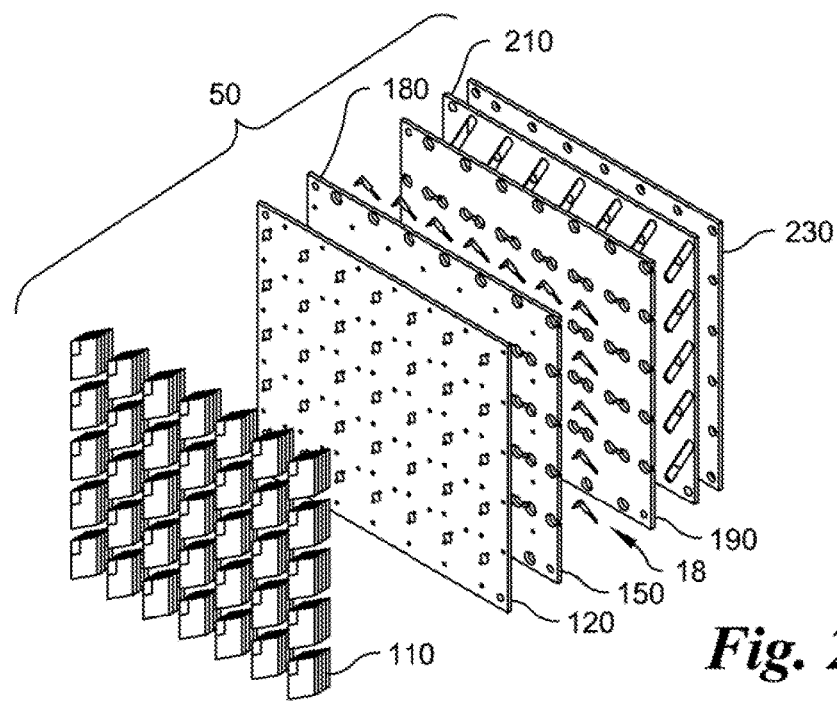
FIG. 2 is an exploded perspective view illustrating a method of manufacturing a plurality of the antenna radiating elements of FIG. 1 according to an embodiment of the present disclosure.
Figure 3:
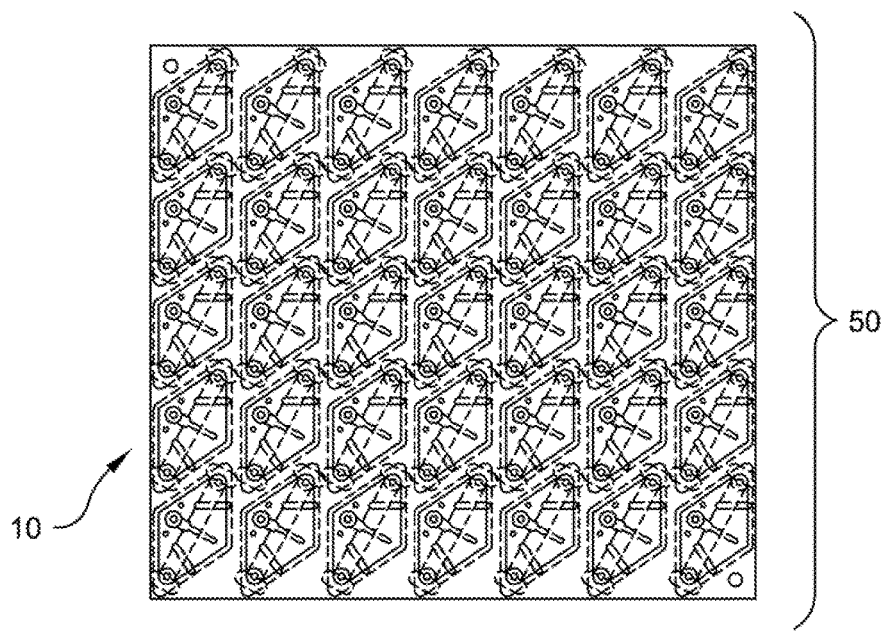
FIG. 3 is a top view illustrating an assembly of a plurality of conjoined antenna radiating elements manufactured according to the embodiment of FIG. 2.

The method of manufacture illustrated in FIGS. 2 and 3 includes forming an assembly including a plurality of conjoined (i.e. joined via a plurality of shared material layers) antenna elements (e.g. thirty-five antenna elements 10 in the illustrated embodiment). As shown, each of the first, second and third dielectric elements 15,19,23 may originate from a respective larger sheet or stock of bulk dielectric material. Specifically, first dielectric sheet 150 includes a plurality of patterns or features machined or formed therein. These features correspond to features 16,17 shown in FIG. 1. The features or patterns thereof are repeatedly formed over the area of the sheet 150, such that a plurality of conjoined first dielectric elements 15 are defined on sheet 150. Likewise, second and third dielectric sheets 190,230 comprise respective features (e.g. features 20,24 as shown in FIG. 1) machined or otherwise formed therein in the repeated pattern so as to define a plurality of conjoined second and third dielectric elements 19,23. Base element sheet 120 (e.g. an aluminum sheet) and metal sheet 210 (e.g. a copper sheet) may be machined or otherwise formed to define a plurality of conjoined base elements 12 and metal elements 21, as shown and described with respect to FIG. 1. It should be understood that each of dielectric and metal sheets 120,150, 190,210,230, as well as the illustrated plurality of radiating elements 18, may be separately or independently preformed or pre-machined prior to assembly.

During manufacture, first dielectric layer 150 may be arranged on or over base element sheet 120. Each radiating element 18 may be placed into one of a plurality of recesses 16 formed in first dielectric sheet 150 (see FIG. 1). Second dielectric sheet 190 may be placed on or over first dielectric sheet 150; metal sheet 210 placed over second dielectric sheet 190; and third dielectric sheet placed over metal sheet 210. The resulting subassembly of stacked layers may be laminated together. A plurality of RF connectors 11 may be attached to this subassembly to create an assembly 50 of conjoined antenna elements 10. Specifically, RF connectors 11 may be preformed and attached to a side of base element layer 120, or a plurality of conjoined RF connectors 11 may be machined from a single piece of metal stock 110, which is subsequently attached to base element layer 120 during the manufacturing process.

Referring generally to FIG. 3, a top view of completed assembly 50 comprising a plurality of conjoined antenna elements 10 is shown. A further machining step (e.g. milling, water jetting, laser and/or CO2 cutting techniques) may be performed on assembly 50 to separate the plurality of conjoined radiating elements 10 into individual components. Thus, manufacturing circuits using thick metals and bulk dielectrics using machining processes, rather than etched metals in multilayer laminated construction, provides easily assembly circuit features at reduced costs.

FIGS. 4A, 4B, 5A, 5B, 6 and 7 illustrate various elements and views associated with an electrical circuit, specifically, a high-power termination, manufactured according to an embodiment of the present disclosure. As set forth above, embodiments utilize preformed bulk dielectric materials to form the electrical insulators of circuits according to embodiments of the present disclosure. FIGS. 4A and 4B illustrate a first electrical insulator 90. Insulator 90 may be machined from bulk dielectric material stock or molded into the illustrated form. Insulator 90 defines a generally elongated first section 93, and a generally elongated second section 95 extending generally perpendicularly from an end of first section 93. An aperture 94 may be formed (e.g. drilled or molded) in an end of second section 95. Insulator 90 further includes a continuous recess 92 formed (e.g. milled or molded) in both first section 93 and second section 95. In one embodiment, recess 92 may be formed using one or more milling operations, wherein dielectric material is removed about a centerline to a desired depth. Recess 92 is configured (e.g. sized) to receive and locate a correspondingly-sized electrically conductive element 84 therein (see FIG. 6).

Referring generally to FIGS. 5A and 5B, a second dielectric insulator 96 is shown. Insulator 96 may be machined from bulk dielectric material stock or molded into the illustrated form. Insulator 96 defines a generally elongated first section 97, and a generally elongated second section 98 extending perpendicularly from an end of first section 97. Insulator 96 includes a recess 99 formed (e.g. milled or molded) in an end of second section 98. Insulator 96 is sized and shaped so as to be joined with or abut insulator 90 when the electrical circuit is assembled, as will be set forth in greater detail herein.

Figure 6:
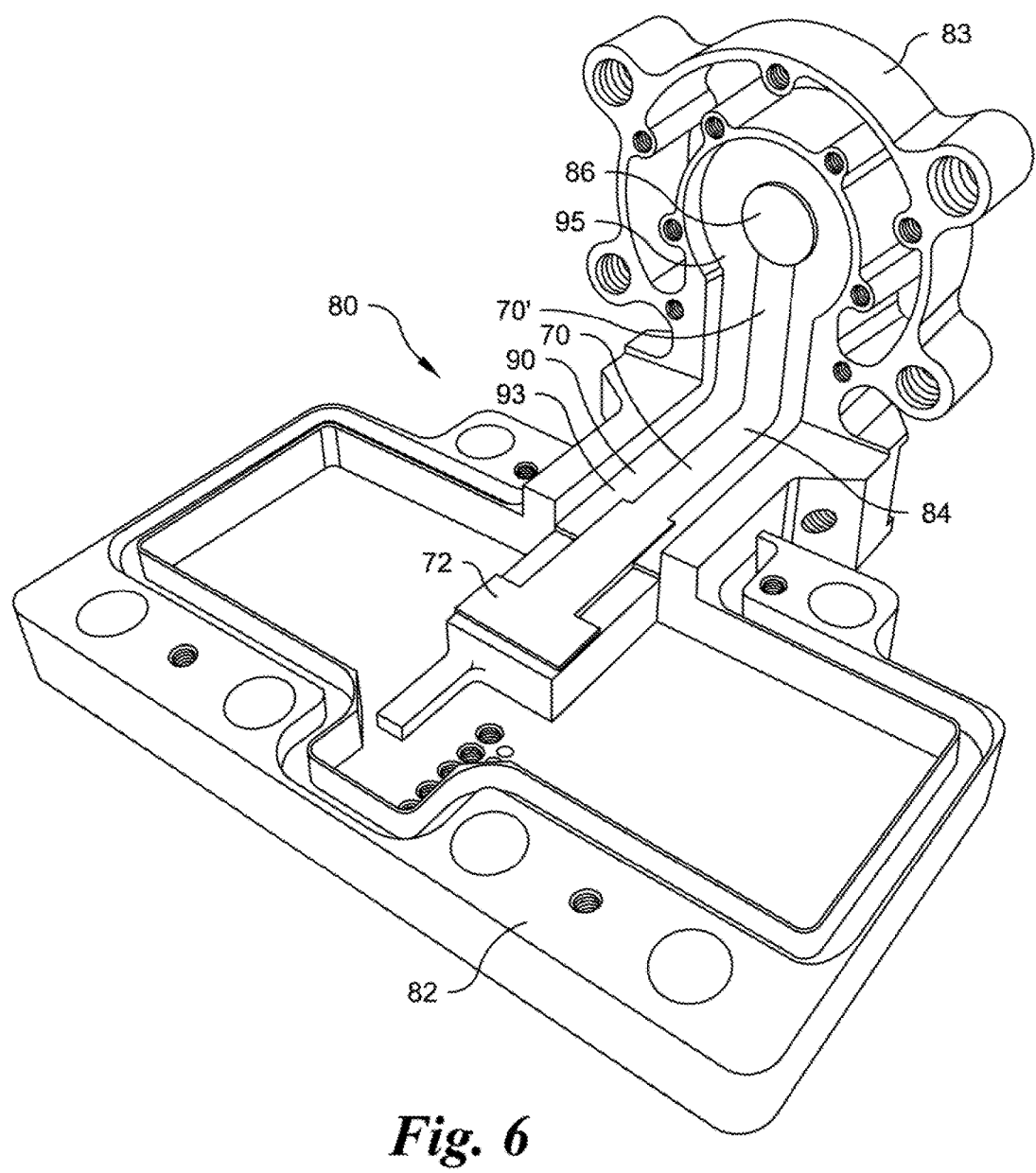
FIG. 6 is a partially-assembled perspective view of an electrical circuit manufactured using the first and second performed bulk dielectric materials of FIGS. 4A-5B.

Referring generally to FIG. 6, there is shown a partially assembled electrical circuit assembly 80 utilizing the above-described electrical insulators 90,96 manufactured according to embodiments of the present disclosure. Circuit assembly 80 includes a machined aluminum base, including a first base portion 82 and a second base portion 83. First and second base portions 82,83 may be fastened to one another to form a singular base assembly, or the base may comprise a single, monolithic component. As illustrated, insulator 90 is placed within correspondingly sized recesses formed in base portion 82 and base portion 83. A conductor 84 is arranged within recess 92 of insulator 90. Conductor 84 comprises a preformed electrically conductive element, which may be manufactured by metal forming processes (e.g. machining, stamping, casting, etc.). Conductor 84 comprises a terminal 86 formed on or attached to an end thereof. During assembly of the circuit, terminal 86 is inserted into aperture 94 of insulator 90, and extends outwardly from an exterior of second base portion 83 (see FIG. 7). While not shown for the purpose of clarity, insulator 96 is configured to be placed over insulator 90 and conductor 84. Specifically, insulator 96 is arranged such that its first and sections 97,98 generally abut first and second sections 93,95 of insulator 90. Depending on the application, these layers may be laminated together to form a single assembled component. The illustrated end of terminal 86 shown in FIG. 6 will reside within recess 99 of insulator 96.

Figure 7:
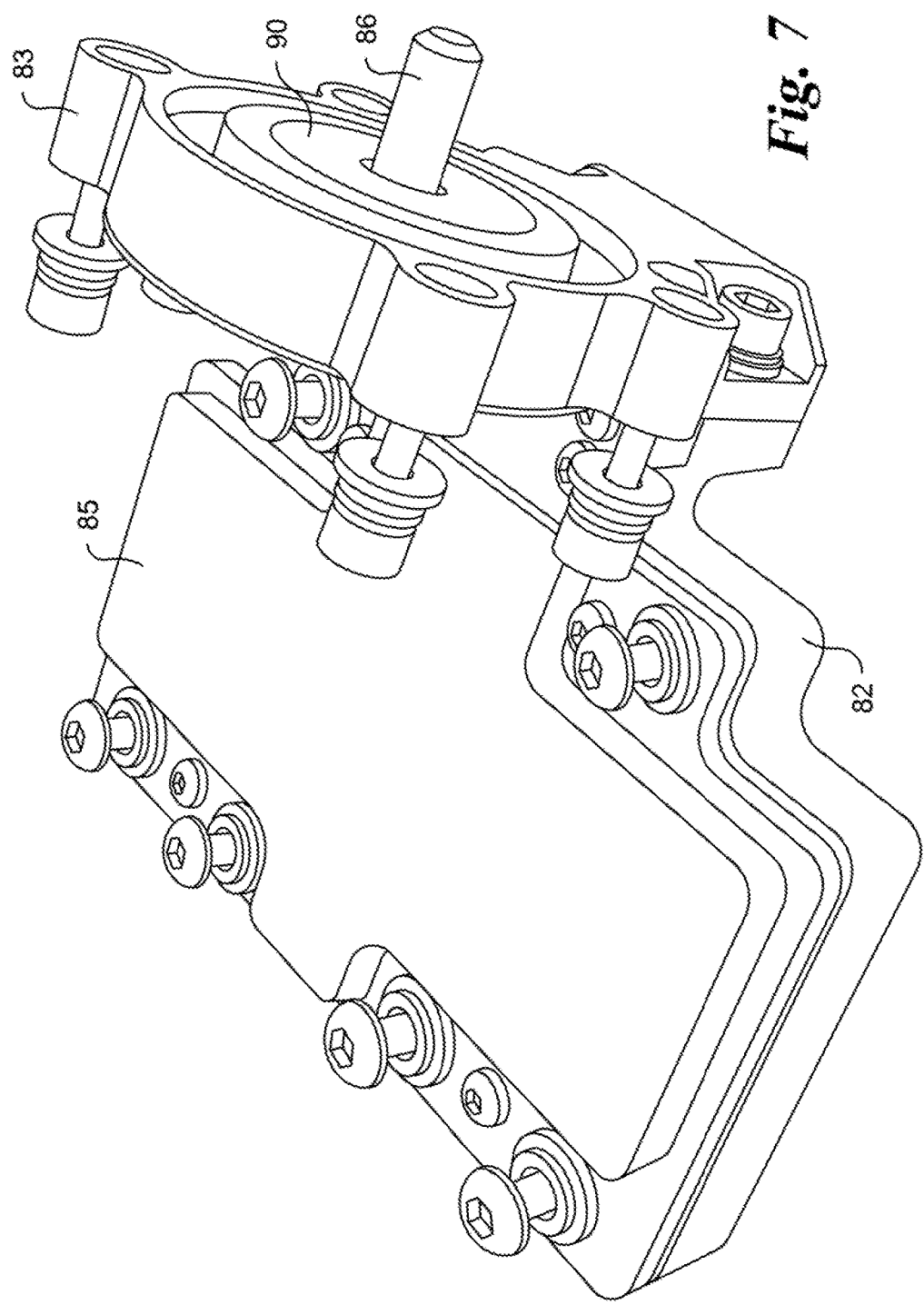
FIG. 7 is an assembled perspective view of the electrical circuit of FIG. 6.

Joining insulators 90 and 96 in the described manner creates a continuous embedded stripline circuit, including a first embedded stripline circuit section 70 oriented generally horizontally with respect to a planar surface of the base assembly, and a second embedded stripline circuit section 70' oriented generally perpendicularly with respect to stripline circuit section 70. An end of conductor 84 left uncovered by insulator 96 defines a microstrip region 72. Referring to FIG. 7, an assembled electrical circuit assembly 80 may include one or more covers 85 affixed to base portions 82,83, completing the electric circuit assembly.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A method of manufacturing a plurality of electrical circuits comprising the steps of: forming an assembly of a plurality of conjoined electrical circuits, the assembly formed by: machining a plurality of first features in a first bulk dielectric material, wherein each first feature is associated with one of the plurality of electrical circuits; machining a plurality of second features in a second bulk dielectric material, wherein each second feature is associated with one of the plurality of electrical circuits; placing a plurality of conductive elements on a first side of the first bulk dielectric material, wherein each conductive element is associated with a respective one of the electrical circuits; and placing the second bulk dielectric material on the first side of the first bulk dielectric material and over the plurality of conductive elements; and machining the assembly to separate each of the plurality of electrical circuits from one another, wherein the step of machining the plurality of first features in the first bulk dielectric material comprises machining the plurality of recesses in the first bulk dielectric material, and wherein the step of placing a plurality of conductive elements on the first side of the first dielectric bulk material comprises placing a conductive element within a respective one of the plurality of recesses; and wherein at least a portion of each of the plurality of recesses are machined to a depth less than a thickness of the first bulk dielectric material.

2. The method of claim 1, wherein the step of forming the assembly of the plurality of conjoined electrical circuits further comprises the step of laminating the first bulk dielectric material and the second bulk dielectric material together.

3. The method of claim 1, wherein the step of forming the assembly of the plurality of conjoined electrical circuits further comprises the steps of: machining a plurality of third features in a first metal material, wherein each third feature is associated with one of the plurality of electrical circuits; and placing the first metal material on the second bulk dielectric material.

4. The method of claim 3, wherein the step of forming the assembly of the plurality of conjoined electrical circuits further comprises the steps of: machining a plurality of fourth features in a third bulk dielectric material, wherein each fourth feature is associated with one of the plurality of electrical circuits; and placing the third bulk dielectric material on the first metal material.

5. The method of claim 3, wherein each of the third features includes an aperture.

6. The method of claim 5, wherein each of the plurality of conductive elements comprises an antenna feed element.

7. The method of claim 6, wherein each of the plurality of electrical circuits comprises a radiating element of an RF antenna.

8. The method of claim 1, wherein the step of forming the assembly of the plurality of conjoined electrical circuits further comprises the steps of: machining a plurality of base assemblies in a second metal material, wherein each base assembly is associated with one of the plurality of electrical circuits; and placing the second metal material on a second side of the first bulk dielectric material.

9. The method of claim 1, wherein the plurality of conductive elements are formed by at least one of machining and casting.

10. The method of claim 1, wherein the first bulk dielectric material is formed from a first sheet of dielectric material, and the second bulk dielectric material is formed from a second sheet of dielectric material.

11. The method of claim 1, wherein the first metal material is a first sheet of metal.

* * * * *